Sept. 14, 1937. W. SOLLER Re. 20,506

OSCILLATOR SYSTEM

Original Filed Sept. 25, 1934

INVENTOR.
Walter Soller,
BY John B. Brady
ATTORNEY.

Reissued Sept. 14, 1937

Re. 20,506

UNITED STATES PATENT OFFICE 20,506

OSCILLATOR SYSTEM

Walter Soller, Cincinnati, Ohio, assignor of one-half to William H. Woodin, Jr., Tucson, Ariz.

Original No. 2,035,574, dated March 31, 1936, Serial No. 745,461, September 25, 1934. Application for reissue September 28, 1936, Serial No. 103,052

16 Claims. (Cl. 250—36)

My invention relates broadly to oscillation generation systems and more particularly to a circuit arrangement for the production of oscillations employing a cathode ray discharge tube.

This application is a continuation in part of my application Serial Number 690,907, filed September 25, 1933 and entitled Electron tube system.

One of the objects of my invention is to provide an oscillation system in which high speed scanning by an electron beam may be controlled.

Another object of my invention is to provide an oscillation system in which a cathode ray tube is employed for the generation of sustained oscillations.

Still another object of my invention is to provide an arrangement of oscillation generator operative over a wide frequency range and employing a cathode ray discharge tube.

A further object of my invention is to provide a deflection type cathode ray discharge tube having means for controlling the electron discharge therein according to the amount of the load supplied by the oscillation circuit.

Another object of my invention resides in the circuit arrangement for a cathode ray discharge tube employing both a deflection system and a space charge control grid for controlling the oscillating condition of the cathode ray discharge tube.

Figure 1:
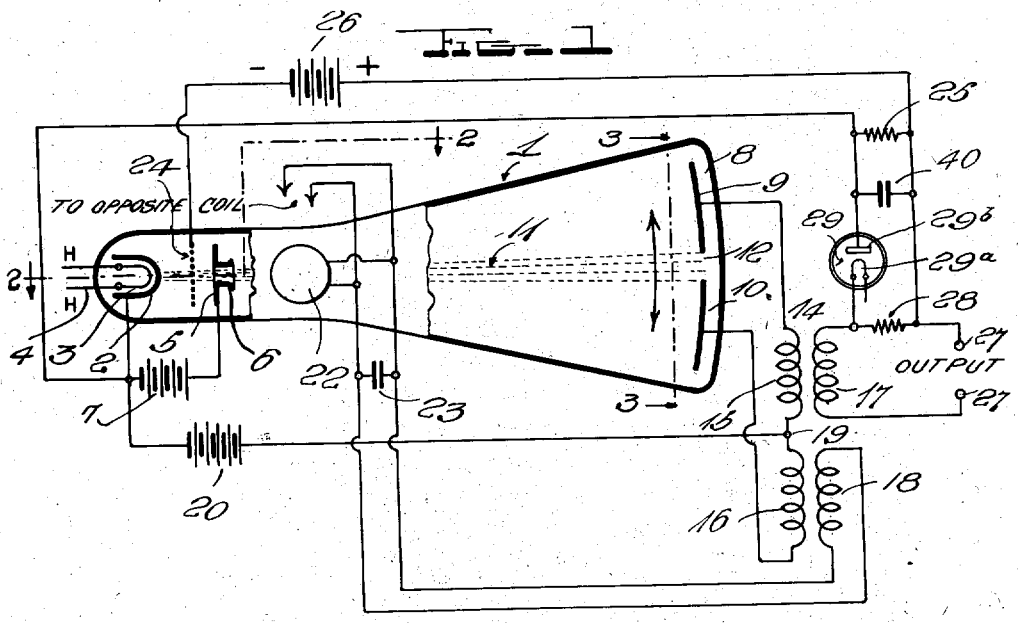
Figure 2:
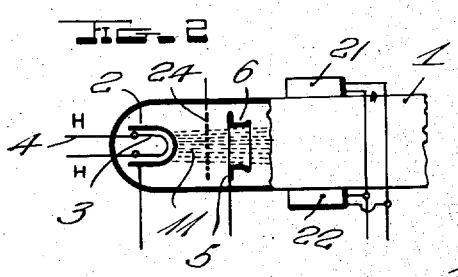
Figure 3:
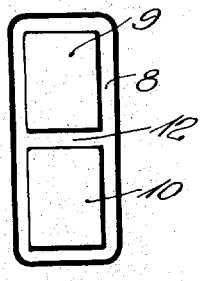
Figure 4:
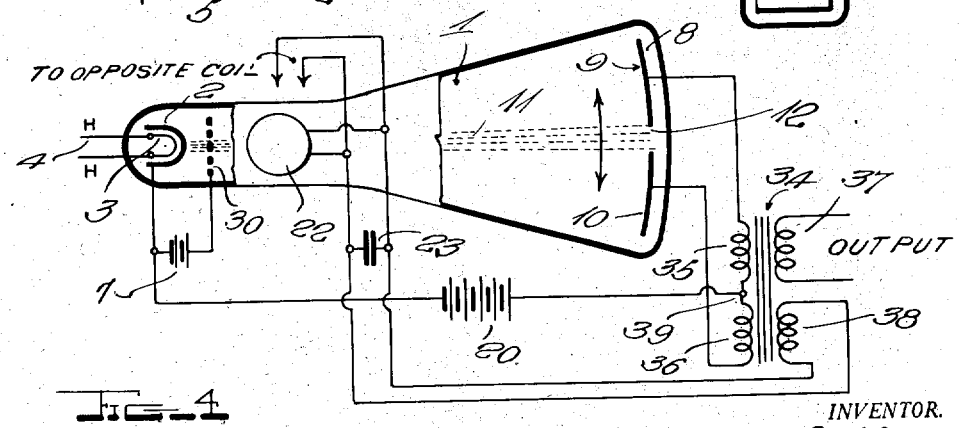

Other and further objects of my invention reside in the circuit arrangement for an oscillation system employing a cathode ray discharge tube, as set forth more fully in the specification hereinafter following by reference to the accompanying drawing, in which:

Figure 1 diagrammatically and schematically shows one circuit arrangement embodying my invention in which the cathode ray tube is illustrated partially in section and partially in side elevation; Fig. 2 is a fragmentary plan view of the cathode ray tube illustrated in Fig. 1 partially broken away to illustrate the arrangement of electrodes therein; Fig. 3 is a cross-sectional view taken on line 3—3 of Fig. 1 showing the arrangement of anodes; and Fig. 4 shows a modified form of cathode ray tube oscillating circuit embodying my invention.

Referring to the drawing in detail, reference character 1 designates the envelope of the cathode ray tube preferably of glass and exhausted to a high degree of vacuum or filled with a gas or vapor of any desired composition. Reference character 2 designates a cathode element having heating means such as filament 3 connected to any suitable source of potential through leads shown at 4 and connected to terminals HH. A formative anode 5 is arranged in the path of the electron discharge from the cathode 2. The formative anode 5 is provided with a substantially rectangular walled aperture 6 through which the electrons are discharged in a beam of substantially rectangular cross-section in an essentially central axis with respect to the plate assembly shown at 8. The plate assembly shown at 8 comprises anode members 9 and 10 which are spaced from each other edge to edge by a gap 12. The oscillation circuit of my invention employs a special transformer indicated at 14 having a pair of primary windings 15 and 16 and a pair of secondary windings 17 and 18. The primary windings 15 and 16 have their inner ends connected together, as indicated at 19, and their remote ends respectively connected to anodes 9 and 10. A circuit is provided between cathode 2 and point 19 in the primary circuit through source of potential 20. A connection is taken from cathode 2 through source of potential 7 to the formative anode 5 for impressing upon formative anode 5 a positive potential. The beam of electrons indicated at 11 is thus projected from cathode 2 through the positively charged formative anode 5 to the anodes 9 and 10, the beam of electrons normally being substantially confined to the gap 12 between the anodes 9 and 10. In order to provide for the deflection of the electron beam alternately from one anode to the other, I provide deflection means and a control grid for varying the electron beam according to the output load. A pair of deflection coils or magnetic control windings 21 and 22 are mounted on opposite sides of the envelope 1 for establishing a magnetic field of such shape as to efficiently embrace an electron beam. The magnetic field is established along an axis normal to the axis of the electron beam 11. The magnetic field tends to deflect the electron beam up or down according to the direction of the magnetic field. The control coils 21 and 22 may or may not be mounted upon a magnetic core. In Fig. 1, I have shown my invention as applied to a high frequency oscillatory system in which there is no magnetic core structure employed to support the deflection coils 21 and 22, thus insuring the high frequency operation of the deflection coils. The secondary winding 18 of transformer 14 connects with the oscillation circuit constituted by magnetic control coils 21 and 22 and condenser 23. In addition to the influence of the deflection coils upon the beam 11, I provide means for varying the electron stream in accordance with the output load comprising the control grid 24 interposed in the path of the electron discharge. The control grid 24 is connected in a path extending from cathode 2 through resistance 25 and source of potential 26. Source of potential 26 tends to impress a negative potential on control grid 24 but the effective potential on control grid 24 is controlled by the potential drop across resistance 25. The potential drop across resistance 25 is controlled in proportion to the output load which connects with secondary winding 17. The output load is connected with terminals 27 which are disposed in circuit with secondary winding 17 through resistance element 28. Resistance element 28 connects across the input circuit of a recifier tube 29. Rectifier tube 29 includes heated cathode 29a and plate electrode 29b connected as shown for purposes of rectifying the potential drop across resistance 28. The output circuit of rectifier tube 29 is shunted by condenser 40 which, in turn, connects with resistance 25 which is of such value that the bias across condenser 40 varies in proportion to variation in the load. The alternating current delivered to the output load builds up a potential across resistance 28. The potential across resistance 28 is rectified and delivered to the circuit including resistance 25. Inasmuch as resistance 25 is in circuit with the space charge control grid 24, the bias impressed upon control grid 24 will change according to the change in potential across resistance 25, which, in, turn, is controlled by the output load. In this way, the control grid 24 serves to change the total amount of electrons projected in electron beam 11. This prevents the oscillating tube from drawing a large amount of power when only a small load is to be driven. The input of the oscillator will vary with the output in this arrangement. The deflection regeneration system coacts with the space charge control grid system in the generation of and in the control of the required oscillatory energy.

The primary current is zero when equal amounts of electrons fall on anodes 9 and 10 as, for example, in the position of electron beam 11 illustrated in the drawing. As the electron beam 11 is deflected up, current goes in one direction through the transformer 14 and as the electron beam 11 is deflected down, current goes in the opposite direction in transformer 14, thereby producing alternating current. The frequency of oscillation is controlled by adjusting the value of inductance in windings 21 and 22 and the size of condenser 23.

Fig. 2 illustrates more clearly the arrangement of the magnetic coils 21 and 22 with respect to the electron beam 11; and Fig. 3 shows the disposition of the elements 9 and 10 in the anode assembly 8.

Fig. 4 shows one arrangement for employing a cathode ray discharge tube for the generation of audio frequency oscillations. In this arrangement, I provide a control grid member 30 in lieu of the formative anode 5 and charge the control grid member 30 at positive potential for controlling the bombardment of anodes 9 and 10 by electron beam 11. In this arrangement, I provide an iron core transformer 34 having primary windings 35 and 36 interconnected at 39 and connected with cathode 2 through potential source 20. Primary windings 35 and 36 have their remote ends connected with anodes 9 and 10. Transformer 34 includes an iron core structure and secondary windings 37 and 38. Secondary winding 38 connects to the oscillatory system including magnetic control coils 21 and 22 and condenser 23. Secondary winding 37 connects to the output circuit of the oscillator. As in the arrangement illustrated in Fig. 1, the deflection of the electron beam up and down causes variable and alternate excitation of the primary windings 35 and 36 producing alternating current in output winding 37. The coils 21 and 22 are wound so that the magnetic field is approximately in phase with the primary current through transformer 34. The values of inductances 21 and 22 and condenser 23 are such that audio frequency currents are delivered to the output circuit 37.

The tube shown in Fig. 4 may be constructed to operate as a mercury vapor or ionized gas tube in lieu of the electronic arrangement as shown.

While I have described my invention in certain preferred embodiments, I desire that it be understood that modifications may be made and that no limitations upon my invention are intended other than are imposed by the scope of the appended claims.

What I claim as new and desire to secure by Letters Patent of the United States is as follows:

1. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray device and including a source of potential and separate branch circuits leading to the elements of said plate assembly, means coupled with said branch circuits and containing an oscillatory control device for alternating the effect of said cathode ray with respect to the elements of said plate assembly, and additional means coupled with said output system for controlling the power input of said discharge device.

2. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray device and including a source of potential and separate branch circuits leading to the elements of said plate assembly, and a plurality of means connected with said branch circuits, one of said means for determining the frequency of oscillations which may be sustained in said circuits, and the other of said means for controlling the intensity of said cathode ray in accordance with the load on said system.

3. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray device and including a source of potential and separate branch circuits leading to the elements of said plate assembly, a pair of electromagnetic windings disposed adjacent the path of said cathode ray, and connections between said branch circuits and said electromagnetic windings for effecting sustained oscillations in said circuits, and means coupled with said output system for controlling the intensity of said cathode ray in accordance with the load.

4. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray device and including a source of potential and separate branch circuits leading to the elements of said plate assembly, an electromagnetic device disposed adjacent the path of said cathode ray and connected with said branch circuits, and a condenser connected with said electromagnetic device and cooperating therewith in determining the frequency of oscillations sustained by said circuits, and means coupled with said output system for controlling the intensity of said cathode ray in accordance with the load.

5. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray device and including a source of potential and separate branch circuits leading to the elements of said plate assembly, a pair of electromagnetic windings aligned one with the other and disposed on opposite sides of the path of the cathode ray, said windings being connected with said branch circuits and effective to deflect said cathode ray, a load circuit connected with each of said branch circuits, and means connected with said load circuit for varying the intensity of said cathode ray in accordance with the load.

6. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray device and including a source of potential and separate branch circuits leading to the elements of said plate assembly, a pair of electromagnetic windings aligned one with the other and disposed on opposite sides of the path of said cathode ray, said windings being connected with said branch circuits and effective to deflect said cathode ray, a load circuit inductively coupled with both of said branch circuits, and means connected with said load circuit for varying the intensity of said cathode ray in accordance with the load.

7. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray discharge device and including a source of potential and separate branch circuits leading to the elements of said plate assembly, a load circuit, means connected with said load circuit for controlling the intensity of said cathode ray, and means coupled with said branch circuits for controlling the deflections of said cathode ray for sustaining oscillations in said load circuit.

8. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray discharge device and including a source of potential and separate branch circuits leading to the elements of said plate assembly, a load circuit, a space charge grid disposed in the path of said cathode ray within said vessel, means connected between said load circuit and said space charge grid for controlling said cathode ray in accordance with the operation of said load circuit, and means connected with said load circuit and disposed adjacent the path of said cathode ray for sustaining oscillations in said load circuit.

9. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray device and including a source of potential and separate branch circuits leading to the elements of said plate assembly, a load circuit coupled with said branch circuits for receiving oscillatory current from said branch circuits, a resistance element connected in said load circuit, a rectifier element and a second resistance element connected in series across said first mentioned resistance element, a space charge control grid disposed in said vessel, a connection from one end of said second resistance element to said space charge control grid and a connection from the other end of said second resistance element to said cathode ray discharge device whereby said grid is biased for controlling said cathode ray in accordance with the load in said load circuit, and means coupled with said load circuit and disposed adjacent the path of said cathode ray for controlling said cathode ray and sustaining oscillations in said load circuit.

10. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray device and including a source of potential and separate branch circuits leading to the elements of said plate assembly, a load circuit coupled with said branch circuits, a space charge control grid in said vessel, means for normally biasing said space charge control grid, and means for deriving an additional potential from said load circuit for controlling the operation of said space charge control grid in accordance with the load connected with said load circuit.

11. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray discharge device and including a source of potential and separate branch circuits leading to the elements of said plate assembly, a load circuit coupled with said branch circuits, a space charge control grid in said vessel, means for normally biasing said space charge control grid, means for deriving an additional potential from said load circuit for controlling the operation of said space charge control grid in accordance with the load connected with said load circuit, and means connected with said load circuit and disposed adjacent the path of said cathode ray for sustaining oscillations in said load circuit.

12. In a cathode ray control system, a closed vessel, a cathode ray discharge device in said vessel, a plate assembly disposed in alignment with said cathode ray discharge device, said plate assembly comprising a pair of independent elements, means for directing the cathode ray from said device to said plate assembly, an output system connected with said cathode ray device and including a source of potential and separate branch circuits leading to the elements of said plate assembly, a load circuit coupled with said branch circuits, a space charge control grid in said vessel, means for normally biasing said space charge control grid, means for deriving an additional potential from said load circuit for controlling the operation of said space charge control grid in accordance with the load connected with said load circuit, and electromagnetic devices disposed on opposite sides of the path of said cathode ray and coupled with said load circuit and coacting with the operation of said branch circuits for sustaining oscillations in said load circuit.

13. An electron tube system comprising an enclosing vessel, a cathode ray discharge device in said vessel, a plate assembly disposed in alignment with said cathode ray discharge device, means for directing an electron beam from said cathode ray discharge device to said plate assembly, means for controlling the deflection of the electron beam with respect to said plate assembly, a load circuit coupled with said plate assembly, a space charge grid disposed in the path of said electron beam, means for impressing a bias potential on said grid, and means for controlling the potential on said grid in accordance with the current in said load circuit for controlling the intensity of the electron beam.

14. An electron tube system comprising an enclosing vessel, a cathode ray discharge device in said vessel, a plate assembly disposed in alignment with said cathode ray discharge device, means for directing an electron beam from said cathode ray discharge device to said plate assembly, means for controlling the deflection of the electron beam with respect to said plate assembly, a space charge grid disposed in the path of said electron beam, and means for controlling the potential on said grid in accordance with load conditions on said system for correspondingly controlling the intensity of the electron beam.

15. In a cathode ray control system, a closed vessel, a cathode ray discharge device in said vessel, a plate assembly disposed in alignment with said cathode ray discharge device and adapted to receive the electrons emitted therefrom, an output system connected with said cathode ray discharge device and said plate assembly, a load circuit coupled with said output system, means energized from said output system for deflecting said cathode ray, and means energized from said load circuit for varying the intensity of said cathode ray.

16. In a cathode ray control system, a closed vessel, a cathode ray discharge device in said vessel, a plate assembly disposed in alignment with said cathode ray discharge device and adapted to receive the electrons emitted therefrom, an output system connected with said cathode ray discharge device and said plate assembly, a load circuit coupled with said output system, and means energized from said load circuit for varying the intensity of said cathode ray.

WALTER SOLLER.